US008409690B2

(12) United States Patent
Wallace et al.

(10) Patent No.: US 8,409,690 B2
(45) Date of Patent: Apr. 2, 2013

(54) PATTERNED NANOWIRES

(75) Inventors: Charles H. Wallace, Portland, OR (US); Matthew L. Tingey, Hillsboro, OR (US); Bradford L. Sun, Portland, OR (US); Timothy L. Hehr, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 420 days.

(21) Appl. No.: 12/776,327

(22) Filed: May 7, 2010

(65) Prior Publication Data

US 2011/0274882 A1 Nov. 10, 2011

(51) Int. Cl.
*B32B 3/00* (2006.01)

(52) U.S. Cl. .......................................... 428/172; 428/166

(58) Field of Classification Search .................. 428/166, 428/172; 977/762; 257/9, E21.119
See application file for complete search history.

(56) References Cited

U.S. PATENT DOCUMENTS

| | | | |
|---|---|---|---|
| 7,521,157 B2 | 4/2009 | Wallace | |
| 7,569,310 B2 | 8/2009 | Wallace | |
| 7,572,557 B2 | 8/2009 | Wallace | |
| 7,632,610 B2 | 12/2009 | Wallace | |
| 7,648,803 B2 | 1/2010 | Sivakumar | |
| 7,692,179 B2 * | 4/2010 | Islam et al. | 257/14 |
| 7,759,028 B2 | 7/2010 | Wallace | |
| 7,820,550 B2 | 10/2010 | Nyhus | |
| 7,915,171 B2 | 3/2011 | Wallace | |
| 2005/0128788 A1 | 6/2005 | Segal et al. | |
| 2007/0231748 A1 | 10/2007 | Sivakumar | |
| 2009/0230380 A1 | 9/2009 | Leon et al. | |
| 2009/0263751 A1 | 10/2009 | Sivakumar | |

FOREIGN PATENT DOCUMENTS

| | | |
|---|---|---|
| KR | 10-2008-0052297 A | 6/2008 |
| WO | 2011/140513 A2 | 11/2011 |

OTHER PUBLICATIONS

Hara, A., et al., "Advanced Self-Aligned DP Process Development for 22-nm Node and Beyond," Advances in Resist Materials and Processing Technology XXVII, Proc. of SPIE, 2010, vol. 7639, 76391T-1-7.

Hara, A., et al., "Advanced self-aligned DP process development for 22-nm node and beyond," 2010 76391-8, Proc. SPIE, vol. 7639.

International Search Report and Written Opinion received for PCT Patent Application No. PCT/US2011/035636, mailed on Feb. 9, 2012, 9 pages.

* cited by examiner

*Primary Examiner* — Catherine A Simone

(57) ABSTRACT

Nanowires suspended from a substrate surface and methods of making nanowires suspended from a substrate surface are provided. The suspended nanowires are comprised of a variety of materials, including metals and mixtures of metals. Suspended nanowires supply large surface areas for applications such as, for example, energy storage and catalysis. Embodiments of the invention provide three dimensional nanowires attached to a substrate surface and arrays of three dimensional nanowires.

11 Claims, 6 Drawing Sheets

Top down view
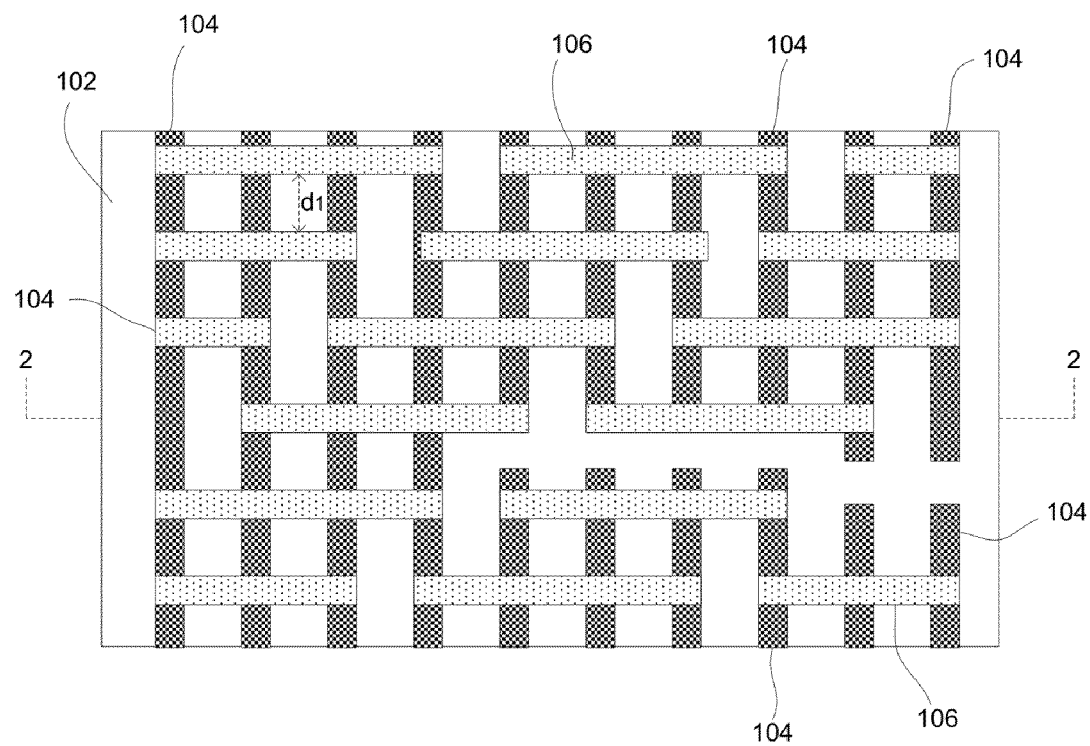
View along 2-2
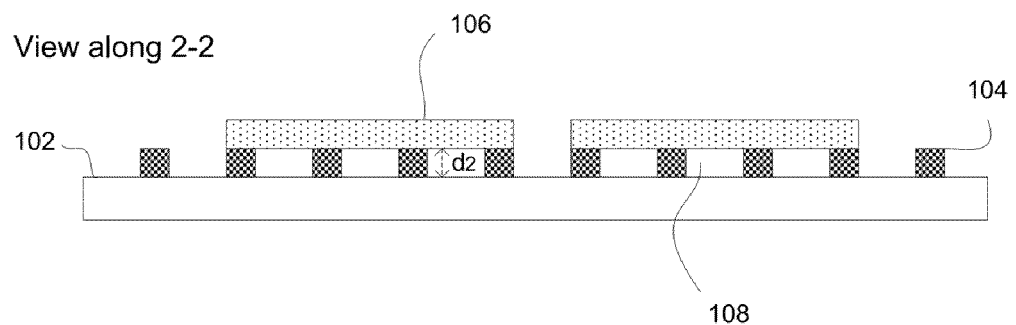
FIGURE 1

A
Top down view
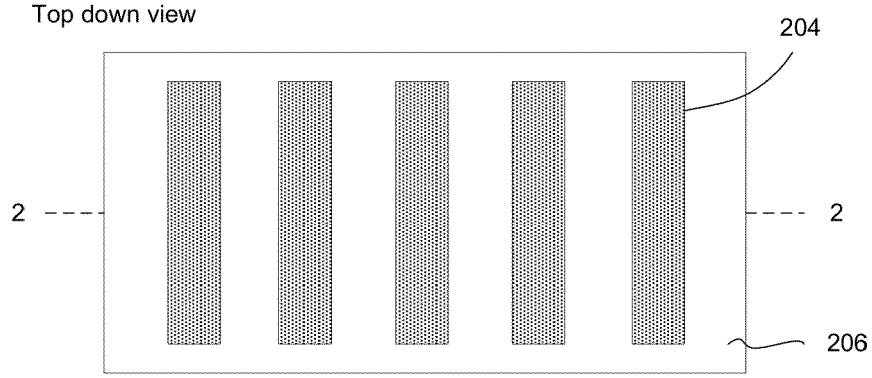
View along 2-2
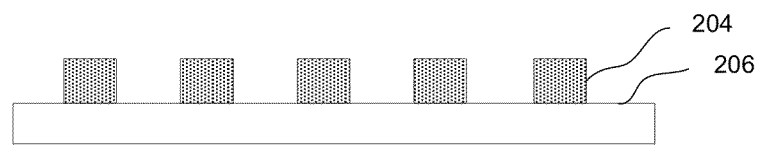
B
Top down view
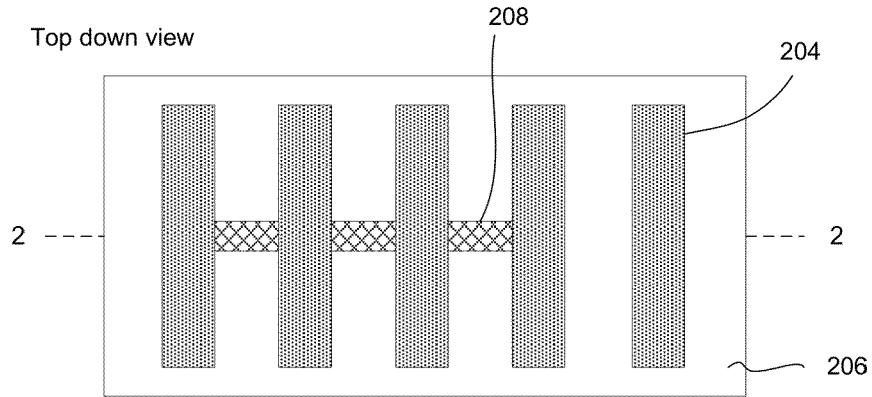
View along 2-2
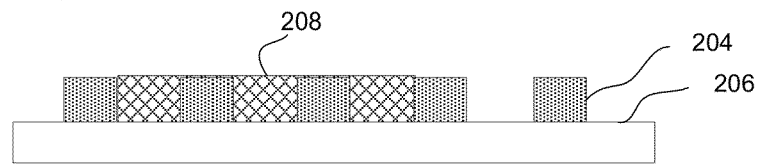
FIGURES 2A-B C
Top down view
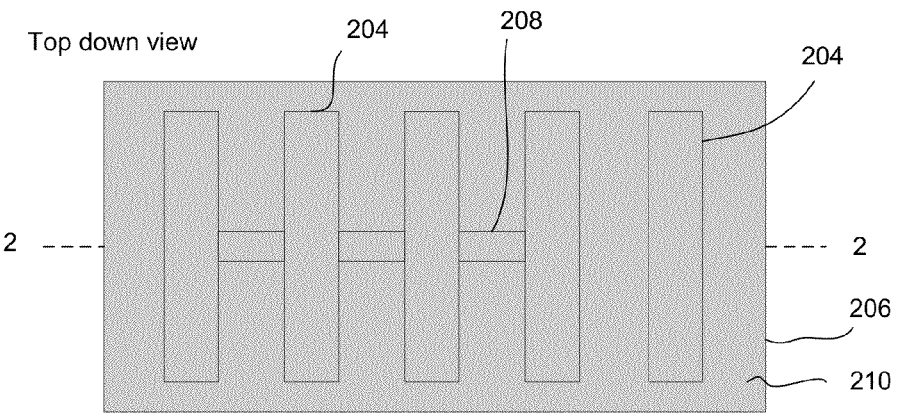
View along 2-2
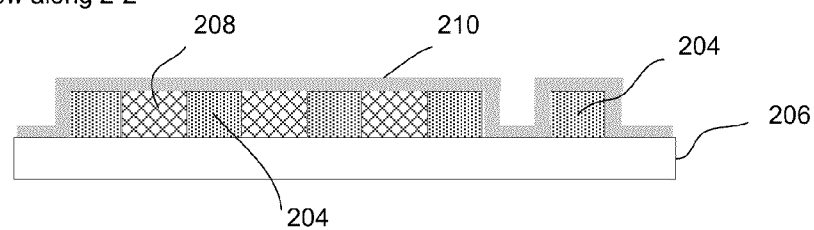
D
Top down view
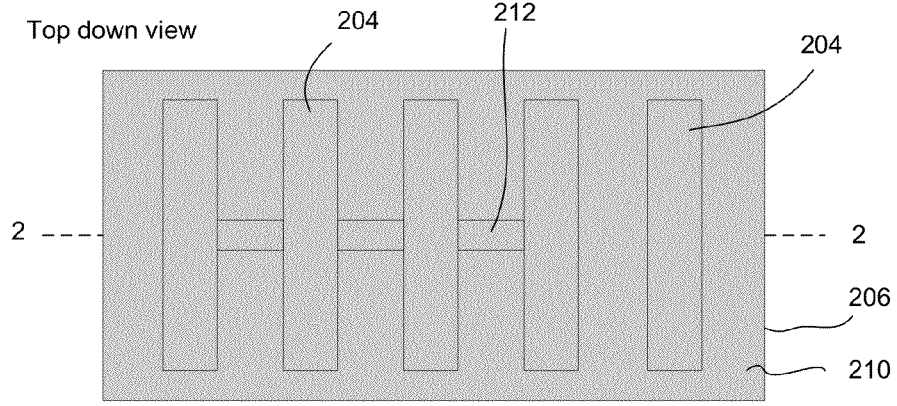
View along 2-2
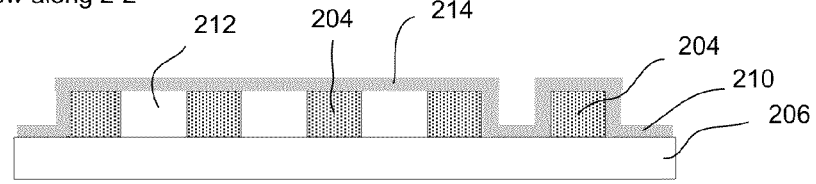
FIGURES 2C-D A
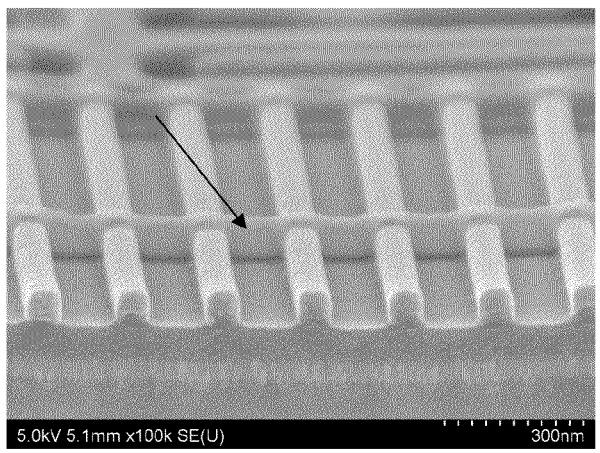
B
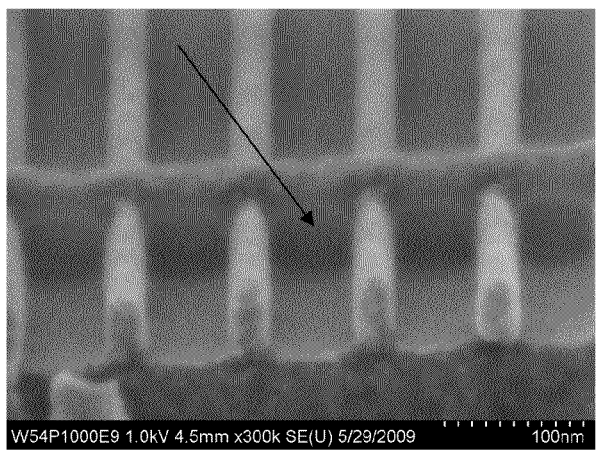
FIGURES 4A-B C
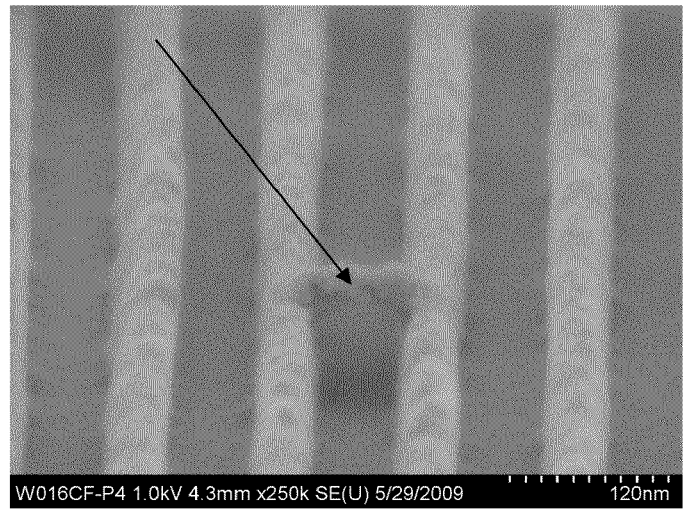
D
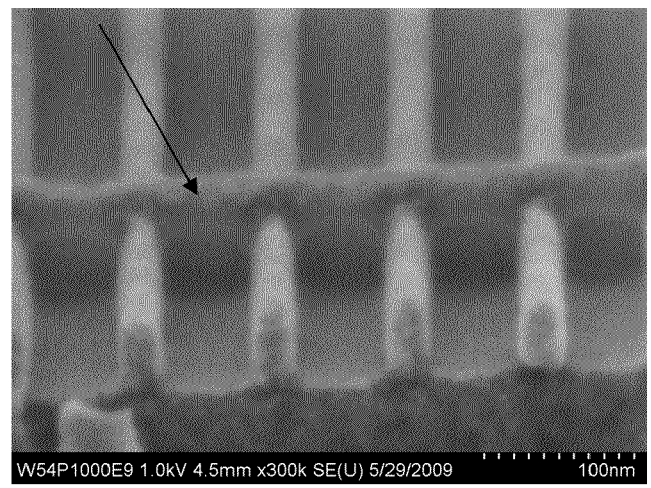
FIGURES 4C-D

PATTERNED NANOWIRES

BACKGROUND OF THE INVENTION

1. Field of the Invention

The embodiments of the present invention relate generally to nanowires, regular patterns of nanowires on a substrate surface, and methods for the manufacture of nanowires on a substrate surface.

2. Background Information

A variety of devices for performing functions such as hydrogen storage and reaction catalysis benefit from having high surface areas associated with the working elements of the device. In hydrogen storage devices, for example, increased surface areas for the absorbent/adsorbent elements associated with the storage function, such as, for example, platinum surfaces, allow more rapid hydrogen sequestration and release and greater amounts of hydrogen gas to be stored in smaller spaces. The ability to efficiently store and release hydrogen gas on demand is essential, for example, for creating hydrogen-powered devices and vehicles. The reversible storage of hydrogen fuel on board a vehicle is generally considered a significant challenge in the development of and for the viability of hydrogen gas-powered vehicles.

BRIEF DESCRIPTION OF THE FIGURES

FIG. 1 shows a section of a nanowire pattern on a substrate surface in which the nanowires are suspended from the substrate surface.

FIGS. 2A-D outline the construction of a complex nanowire mesh on a substrate surface in which there is a gap between the nanowires and the substrate surface.

FIGS. 4A-D show electron micrographs of nanowires suspended from a substrate surface.

DETAILED DESCRIPTION OF THE INVENTION

Figure 3:
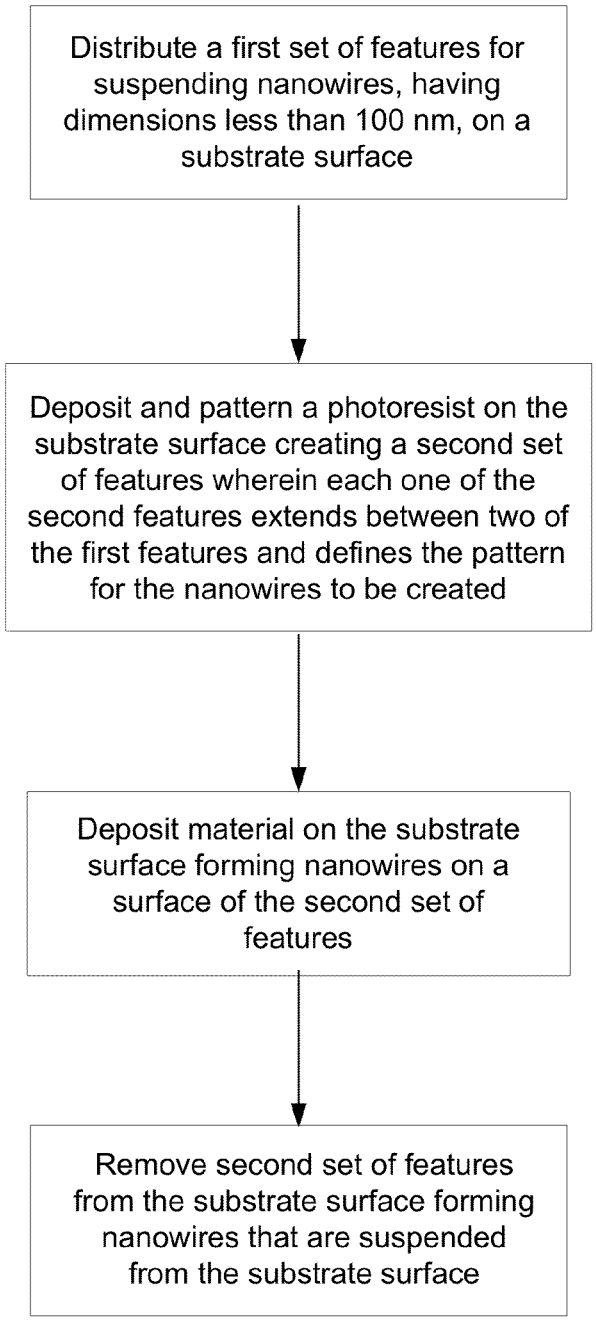
FIG. 3 provides a flow-chart demonstrating the construction of a complex nanowire mesh attached to a substrate surface.

Embodiments of the present invention provide regular arrays of nano features on the surface of a substrate. In embodiments of the invention, nano features associated with a substrate surface have high surface areas, in part, because the nano features are suspended from the substrate surface. Nano arrays of features are useful, for example, in structures useful for catalyzing reactions. for storing energy, and for thermoelectric heating and cooling. For example, devices, such as hydrogen storage nanowire arrays, having platinum features displaying a high surface area find employment in energy storage applications.

FIG. 1 provides an exemplary structure in which nanowire features are suspended above a substrate surface. In FIG. 1, a substrate 102 houses raised features 104 supporting nanowires 106. Although in the example of FIG. 1, a regular pattern or array of nanowires is depicted, a variety of regular, irregular, and mixtures of patterns are possible. Advantageously, though, the present invention allows the creation of arrays of nanowires having defined patterns and sub 100 nm feature dimensions. Typically, in creating a device having an array of suspended nanowires, the pattern of features is selected to optimize considerations such as manufacturing costs, device applications, and operating efficiencies. Nanowires in embodiments of the invention have diameters, for example, in the range of 10 nm to 100 nm, 10 nm to 50 nm, and or 10 nm to 20 nm. In general, useful edge-to-edge distances between nanowires ($d_1$) are in the range of, for example, 20 nm to 500 nm, 20 nm to 200 nm, or 20 nm to 100 nm, although the distance between nanowires can also be much larger, such as, for example, on the order of centimeters (cm) or larger. The suspension of the nanowires 106 from the substrate 102 surface leads to a gap 108 having a height ($d_2$) between a surface of a section of the nanowire 106 and the substrate 102 surface. The height ($d_2$) of the gap 108 typically is a value in the range of 10 nm to 500 nm, 20 nm to 150 nm, 20 nm to 200 nm, and or 40 nm to 100 nm. The number of nanowire features on a substrate surface depends, in part, on the size of the nanowire features themselves and the use to which the resulting device will be put (and considerations such as, for example, the cost of manufacture, the active nanowire surface area desired, and the durability of the resulting device.) Current semiconductor manufacturing techniques allow the creation of devices having as many as billions of features per square centimeter.

FIGS. 2A-D demonstrate the construction of a metal mesh comprised of nanowire features suspended from and attached to a substrate surface. In FIGS. 2A-D only a portion of the entire mesh that is created is shown for clarity. In FIG. 2A, raised features 204 are patterned on substrate 206. Raised features 204 are created using conventional semiconductor patterning processes, the selection of which depends, in part, on the material composition of the features 204. For example, for raised features 204 comprised of a photoresist, features are patterned using lithographic techniques that are standard in the semiconductor industry. A photoresist is spread over the substrate 206 surface, lithographically patterned (using a mask, for example, to define desired features), and selectively removed (developed) to create features 204. Development of features according to the lithographically defined pattern occurs, for example, through the use of a solvent that dissolves the pattern in the areas that received incident electromagnetic radiation (for a positive photoresist) or that remained dark (for a negative photoresist). The photoresist defining features 204 is then frozen making it impervious to removal during the removal of the second photoresist of FIG. 2B. Freezing of the photoresist is accomplished, for example, thermally, chemically, through radiation exposure (such as a UV cure, or an implant process), through a plasma process (such as a HBr plasma), by depositing a thin shell of oxide on the surface of the photoresist, or through other known techniques used in the semiconductor industry. The pattern in the first photoresist defining features 204 is frozen or protected, for example, by coating the pattern with a protective shell. A protective shell is formed by cross-linking the resist either chemically, or by radiation exposure, or through the deposition of an insulating substance, or combinations thereof. Alternately, features 204 are comprised of, for example, a material such as an oxide, silicon nitride, a metal, a polymer, a metal oxide, titanium nitride, gallium arsenide, or diamond-like carbon. The substrate 206 is provided with an oxide layer (or other material), the layer is coated with a photoresist, the photoresist is lithographically patterned (using a mask, for example) and partially removed according to the lithographic pattern (so that for a negative photoresist, portions of the photoresist exposed to radiation remain after photoresist removal and for the positive photoresist, portions of the photoresist exposed to radiation are solubilized and removed so that unexposed portions of the positive photoresist remain after patterning and removal), the exposed oxide layer on the substrate 206 surface is etched, and the remaining photoresist is removed, to provide features 204 that are comprised of oxide (such as $SiO_2$). Etching of an oxide layer, such as a layer comprised of $SiO_2$ is performed, for example, using a plasma etch that etches the portion of the substrate not covered by photoresist. In a further alternate example for creating features 204, a technique such as, double patterning is used. The double patterning technique is described in, for example, Hara, A., et al., "Advanced self-aligned DP process development for 22-nm node and beyond," *Proc. SPIE*, Vol. 7639, 76391 (2010), M. Maenhoudt, M., et al., "Double patterning scheme for sub-0.25 K1 single damascene structures at NA=0.75, λ=193 nm," *Proc. SPIE*, Vol. 5754, 1508-1518 (2005), and Jung, W-Y, et al., "Patterning with spacer for extending the resolution limit of current lithography tool," *Proc. SPIE*, Vol. 6156, 61561J (2006). Although rectangular supporting features are demonstrated, nanowire supporting features can be of different shapes, such as for example, square, circular, semicircular, and or ovoid shapes as viewed from above, and or shapes that have regular or irregular multisided profiles as viewed from above. Raised features 204 have a height of between 10 and 500 nm, between 10 and 250 nm, or between 20 and 200 nm.

In FIG. 2B, a photoresist is used to create a pattern for the nanowires. In FIG. 2B, a second photoresist is applied to the substrate 206 surface, lithographically patterned, and removed according to the lithographic pattern (depending on whether a positive or a negative photoresist is used, as described above). After patterning and development of the second photoresist, a second feature 208 remains and defines the pattern for nanowires to be created. Although the height of second features 208 is the same as the height of first features 206 in FIG. 2B, other relative heights are also possible, such as second features that are as much as 30% shorter or taller in height than first features 206. Additionally, although in FIG. 2B, the second features 208 are shown as orthogonal to the first features 206 and uniform in shape, however it is not necessary that the first and second features be orthogonal to one another or that the second features 208 be uniform in shape, and other geometric arrangements and shapes are possible. In FIG. 2C, the material that the nanowires are comprised of is applied to the substrate 206. In general, any material that can be deposited anisotropically at a low enough temperature, i.e., a temperature that does not cause the photoresist to melt, is useful in embodiments of the present invention. For example, if the nanowires are a metal, such as Pt, Pd, Ni, Au, Ag, Cu, Ti, Ru, or a mixture (alloy) thereof, the nanowires are sputtered onto the surface (using, for example, standard semiconductor processing sputter techniques). Other types of materials are also possible for creating nanowires, such as, for example, bismuth (Bi), selenium (Se), tellurium (Te), and alloys thereof. Bismuth, selenium, and tellurium are useful, for example, in solid-state cooling applications that employ the thermoelectric effect. In FIG. 2C the substrate 206 and features 204 and 208 are coated with the material 210 that will form the nanowires. In FIG. 2D the photoresist 208 (FIG. 2C) is removed forming nanowires of material 210 having a gap 212 between the substrate 206 and the suspended nanowire 214. Removal of the photoresist 208 is accomplished using standard semiconductor processing techniques. For example, the photoresist 208 is dissolved from substrate 206 using a photoresist solvent, or the photoresist 208 is exposed to an electron beam, ion beam, heat, oxygen plasma ash, or other technique known in the semiconductor industry. Alternatively, the photoresist is removed in the same processing event in which the nanowires are deposited onto the substrate surface.

FIG. 3 provides a flow diagram illustrating a process for forming nanowires suspended from a substrate surface. Advantageously, the process of FIG. 3 is amenable to manufacturing large arrays of suspended nanowire features. In FIG. 3 an array of suspended nanowires on a substrate surface is formed by creating a first set of features on the substrate surface and depositing and patterning a second set of features on the substrate surface. Each feature of the second set of features extends between two features from the first set of features. The second set of features defines the pattern for the nanowires. A material is deposited onto the second set of features creating the nanowires. The second set of features is then removed from the substrate surface creating suspended nanowire features on the substrate surface.

FIGS. 4A-F show electron micrographs of suspended nanowires. In FIG. 4A, a metal nanowire is shown supported by a first set of features and resting on a second set of features. An arrow points to the second feature that in FIG. 4B becomes an air gap after exposure to an electron beam of sufficient power (i.e., current, voltage). In FIG. 4A, the scanning electron micrograph was taken at 5.0 kV and is shown at 100 K magnification. In FIG. 4B a nanowire is suspended between first features creating an air gap between the nanowire and the substrate surface. An arrow points to the air gap in FIG. 4B. In FIG. 4B, the scanning electron micrograph was taken at 1.0 kV and is shown at 300 K magnification. FIGS. 4C-D show a 20-30 nm metal nanowire suspended on top of a metal coated photoresist. An arrow points to the metal nanowire in FIGS. 4C-D. In FIG. 4C, the scanning electron micrograph was taken at 1.0 kV and is shown at 250 K magnification. In FIG. 4D, the scanning electron micrograph was taken at 1.0 kV and is shown at 300 K magnification. In FIGS. 4A-F, the first set of features on which the nanowires are resting is a photoresist coated with a thin gold/palladium alloy film for improved SEM imaging. The gold/palladium alloy was sputtered onto the substrate surface to create the nanowires. In this embodiment, the deposition process poked a hole and removed the second photoresist creating the air gap shown.

Advantageously, the methods provided according to embodiments of the invention are useful for creating suspended nanowire features in which the nanowire is made from any of a variety of materials. In general, as mentioned above, any material that can be deposited anisotropically at a low enough temperature, i.e., a temperature that does not cause the photoresist to melt, is useful in embodiments of the present invention to create suspended nanowires. For example, nanowires that are suspended from a substrate surface are comprised of metals, such as for example, Pt, Pd, Ni, Au, Ag, Cu, Ti, Ru, or an alloy thereof are provided according to embodiments of the invention. Additionally, the wires can be bismuth (Bi), selenium (Se), tellurium (Te), and alloys thereof, or any metallic element or an alloy thereof. Additionally, nanowires can be comprised of metal oxides or compounds containing metals, such as metal silicides, or semiconductor materials, such as silicon or doped silicon.

Arrays typically comprise patterns of features or comprise sections of differently patterned features. The size of the array chosen typically depends on the end use of the array and factors such as cost of materials and manufacture. Substrates containing nanowires according to embodiments of the invention comprise as few as one nanowire or as many as billions of nanowires per square centimeter. Arrays comprise, for example, 2 to $10^8$, 5 to $10^8$, 10 to $10^8$, 100 to $10^8$, $10^3$ to $10^8$, $10^4$ to $10^8$, 100 to $10^7$, $10^3$ to $10^7$, 10 to $10^5$, 100 to $10^5$, $10^3$ to $10^5$ nanowires. Embodiments of the invention also include semi-randomized, randomized, and or combinations thereof of mesh-type structures comprised of suspended nanowires.

In general, nanowires have average diameters that are less than 100 nm. Typically nanowires have diameters greater than 10 nm. The minimum size of the dimensions of the nanowires is determined, in part, by the limitations of the equipment used to fabricate the nanowires, although the dimensions chosen will typically depend also on other factors, such as the end use for the array of nanowires. The length of the nanowire is between 20 nm and the maximum dimension of the substrate surface to which the nanowires are attached. The length of the nanowire, is, for example, 20 nm to 10 cm, 20 nm to 4 cm, 20 nm to 1 cm, 20 nm to 0.5 cm, 40 nm to 10 cm, 40 nm to 4 cm, 40 nm to 1 cm, or 40 nm to 0.5 cm.

In an embodiment of the invention, a regular array of nanowires that are suspended above a substrate surface is provided. The nanowires are suspended above the substrate surface through their contact with raised features on the substrate surface. Each nanowire is in contact with at least two raised features. The raised features have a height of between 10 nm and 500 nm above the substrate surface. Typically, the substrate comprises at least 1 nanowire and optionally comprises billions of nanowires, wherein the nanowires are attached to the substrate surface through their contact with at least two raised features. A section of each nanowire is separated from the substrate surface by a gap wherein the gap has a height of between 10 nm and 150 nm and the edge to edge distance between nearest neighbor nanowires is at least 10 nm.

In general, the substrate is comprised of a material that is amenable to semiconductor fabrication processes. For example, the substrate can be a silicon wafer of the type typically used in the semiconductor industry or a substrate formed from, for example: glass ($SiO_2$), coated glass, quartz, gallium arsenide (GaAs), indium anitmonide (InSb), polymer, coated polymer, metal, coated metal, or a substrate formed from a combination of materials.

Embodiments of the invention employ lithographic techniques. Lithography is a process used in the semiconductor industry to create detailed features on a substrate, such as a silicon wafer. Typically, lithography involves coating a photoresist on the surface of the substrate to be patterned, soft baking the photoresist coating layer, patterning the photoresist with electromagnetic radiation through a mask, post exposure baking the photoresist layer, and removing the resist in radiated or unradiated areas, depending on the type of photoresist used (i.e., a positive or a negative photoresist). Photoresists that can be used in embodiments of the invention are comprised of a polymer and a solvent. Optionally, the photoresist used also contains sensitizers or other additives that improve aspects of the performance of the photoresist. Positive photoresist polymers include, for example, m-cresol-formaldehyde, and negative photoresists include, for example, poly isoprene, poly(methyl methacrylate), poly(methyl isopropenyl ketone), poly(butane-1-sulfone) and poly(trifluoroethyl chloroacrylate). Sensitizers are typically added to photoresist compositions to alter the photoresists' sensitivity to electromagnetic radiation. Additives include compounds that inhibit the dissolution of non-exposed portions of the photoresist during the development/etching process. Photoresists are developed typically through their exposure to UV radiation, deep UV radiation, electron beam radiation, or X-ray radiation.

In various embodiments of the invention, arrays of nanowires are incorporated into a larger apparatus and/or system. In certain embodiments, the substrate is incorporated into a microfluidic device and or a micro-electro-mechanical system (MEMS). MEMS are integrated systems comprising mechanical elements, sensors, actuators, and electronics. Microfluidic devices comprise channels and chambers for fluid flow and reaction and optionally, for example, components for monitoring and controlling temperature, filtering, mixing fluidic solutions, and or applying electric or magnetic fields. All of those components are optionally manufactured by known microfabrication techniques on a common chip, comprising a silicon-based or equivalent substrate. The sensor components of MEMS may be used to measure mechanical, thermal, biological, chemical, optical and/or magnetic phenomena. The electronics optionally process the information from the sensors and control actuator components such as pumps, valves, heaters, coolers, and filters, thereby controlling the function of the device. Optionally, some or all of the electronics are located in the substrate.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and/or structures may be included and/or described features may be omitted in other embodiments.

We claim:

1. A device comprising,
a substrate having, a surface wherein the surface comprises a plurality of raised features wherein the raised features have a height of between 10 nm and 500 nm above the substrate surface,
between 10 and $10^8$ coplanar nanowires wherein the nanowires are attached to the substrate surface through their contact with at least two raised features and a section of each nanowire is separated from the substrate surface by a gap wherein the gap has a height of between 10 nm and 500 nm and the edge to edge distance between nearest neighbor nanowires is a value between 10 nm and 500 nm.

2. The device of claim 1 wherein the nanowires are comprised of a metal selected from the group consisting of Pt, Pd, Ni, Au, Ag, Cu, Ru, Ti, Bi, Se, Te and alloys thereof.

3. The device of claim 1 wherein the nanowires are comprised of a material selected from the group consisting of metal oxides, metal silicides, silicon, and doped silicon.

4. The device of claim 1 wherein the resulting array comprises between 100 and $10^8$ nanowires.

5. The device of claim 1 wherein the resulting array comprises between $10^3$ and $10^8$ nanowires.

6. The device of claim 1 wherein the resulting array comprises between $10^3$ and $10^5$ nanowires.

7. The device of claim 1 wherein the raised features are comprised of silicon dioxide, photoresist, silicon nitride, a metal, a polymer, a metal oxide, titanium nitride, gallium arsenide, or carbon.

8. The device of claim 1 wherein the length of the nanowires is between 10 nm and 10 cm.

9. The device of claim 1 wherein the length of the nanowires is between 20 nm and 1 cm.

10. The device of claim 1 wherein the length of the nanowires is between 20 nm and 0.5 cm.

11. The device of claim 1 wherein the gap has a height of between 20 nm and 150 nm.

* * * * *